United States Patent [19]
Mandelcorn

[11] Patent Number: 5,648,896
[45] Date of Patent: Jul. 15, 1997

[54] INVERTER DEVICE USING CAPACITANCE FOR CONTROLLING WAVEFORM SLEW DURING VOLTAGE POLARITY TRANSITIONS

[75] Inventor: Yehoshua Mandelcorn, Dallas, Tex.

[73] Assignee: Lucent Technologies Inc., Murray Hill, N.J.

[21] Appl. No.: 511,389

[22] Filed: Aug. 4, 1995

[51] Int. Cl.⁶ ................................................. H02M 7/537
[52] U.S. Cl. ................................................. 363/132; 363/98
[58] Field of Search .................................. 363/95, 97, 98, 363/131, 132

[56] References Cited

U.S. PATENT DOCUMENTS 4,158,224  6/1979  Kreyer et al. .
4,860,189  8/1989  Hitchcock ........................... 363/132
4,876,635  10/1989  Park et al. ....................... 363/132 X
5,001,621  3/1991  Egawa .

*Primary Examiner*—Peter S. Wong
*Assistant Examiner*—Y. J. Han
*Attorney, Agent, or Firm*—Alfred G. Steinmetz

[57] ABSTRACT

A DC voltage polarity switching circuit includes four switches connected in a bridge configuration. Switches in opposing legs are paired with each other and turned on and off in alternate phases to deliver a low frequency alternating signal having a trapezoidal waveform to a co-axial cable load. Circuitry is included to control the slew rate when the output signal transitions from one polarity to the other. Also, turn on of a switch in one phase is delayed during turn off of a switch in the end of the interval of presently conducting switches in one phase.

4 Claims, 1 Drawing Sheet

INVERTER DEVICE USING CAPACITANCE FOR CONTROLLING WAVEFORM SLEW DURING VOLTAGE POLARITY TRANSITIONS

FIELD OF THE INVENTION

This invention relates to an inverter circuit or battery/DC voltage polarity switch for generating a low frequency AC voltage.

BACKGROUND OF THE INVENTION

A Battery/DC Voltage Polarity Switch uses four switches to switch the polarity of the battery connections to an output co-axial cable load. Half of the time positive DC voltage is tied to a co-axial cable outer sheath and negative DC voltage to a co-axial inner sheath, and the other half of the time negative DC voltage is tied to the co-axial cable outer sheath and positive DC voltage to the co-axial inner sheath.

The transitions from one voltage polarity orientation to another are done at a controlled periodic rate. If polarity transitions are too abrupt excessive electrical noise occurs in the load circuitry connected to the co-axial cable. It is therefore desirable to provide a controlled transition from one polarity of the DC voltage to the other polarity.

SUMMARY OF THE INVENTION

Therefore in accord with the invention, a scheme is provided to achieve a controlled transition from one DC voltage to the other and additionally prevent simultaneous conduction of 2 switches connected in series across the DC voltage/battery input.

In a particular exemplary embodiment, a DC voltage polarity switching circuit includes four switches connected in a bridge configuration. Switches in opposing legs are paired with each other and turned on and off in alternate phases to deliver a low frequency alternating signal having a trapezoidal waveform to a co-axial cable load. Circuitry is included to control the slew rate when the output signal transitions from one polarity to the other. Also, turn on of a switch in the new phase is delayed during turn off of a switch in the end of the interval of presently conducting switches in the previous phase.

BRIEF DESCRIPTION

Figure 1:
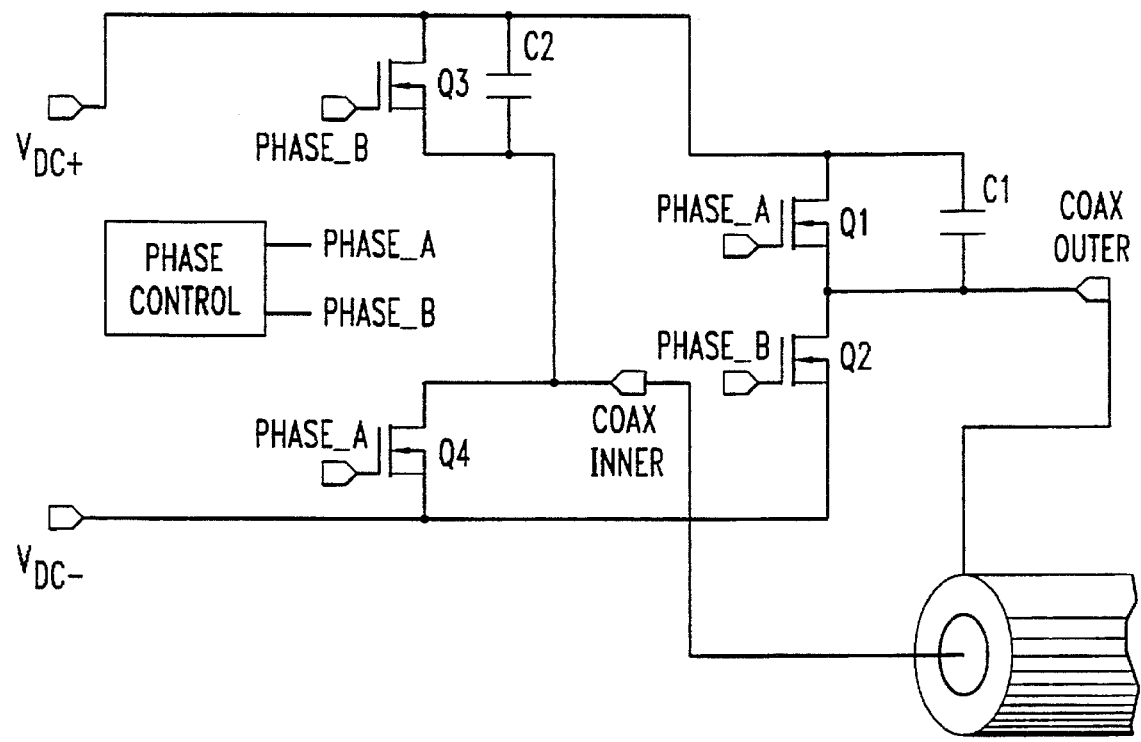
FIG. 1 is a schematic of a battery DC/voltage polarity switching circuit.

An unregulated Battery Polarity Switch is shown in FIG. 1. The circuit embodies four power switches connected in a bridge type configuration for inverting a DC voltage supplied by a battery connected to the inputs $V_{DC}+$ and $V_{DC}-$. The power train consists of 4 switches connected in an H-Bridge off the DC voltage/Battery with opposite legs being turned on and off in alternative cycles to deliver an alternating trapezoidal wave to an output load comprising a coaxial cable. The switches are shown in the figure as power MOSFET's, but could also be embodied as bipolar transistors. The output terminals COAX inner and COAX outer, in the illustrative embodiment, are connected to the inner sheath and the outer sheath of a coaxial cable, with the output tied to the "COAX inner" and the output return tied to "COAX outer". It is to be under stood that the invention is not restricted to coax loads but in general can be any load connection.

The switching cycle of the polarity switch of FIG. 1 is split into 2 phases, A and B, each operative for 50% of the time period. During Phase A: Q1 is turned on pulling COAX outer to $V_{DC}+$ and Q4 is turned on pulling COAX inner to VDC-. During Phase B: Q2 is turned on pulling COAX outer to $V_{DC}-$ and Q3 is turned on pulling COAX inner to $V_{DC}+$.

In accord with invention, the transition between the two states, phase A and phase B, is performed in a controlled time period to limit electrical noise at the load. Hence, in accord with the invention, means for controlling the slew rate of the inner coax and outer coax voltages is provided.

Figure 2:
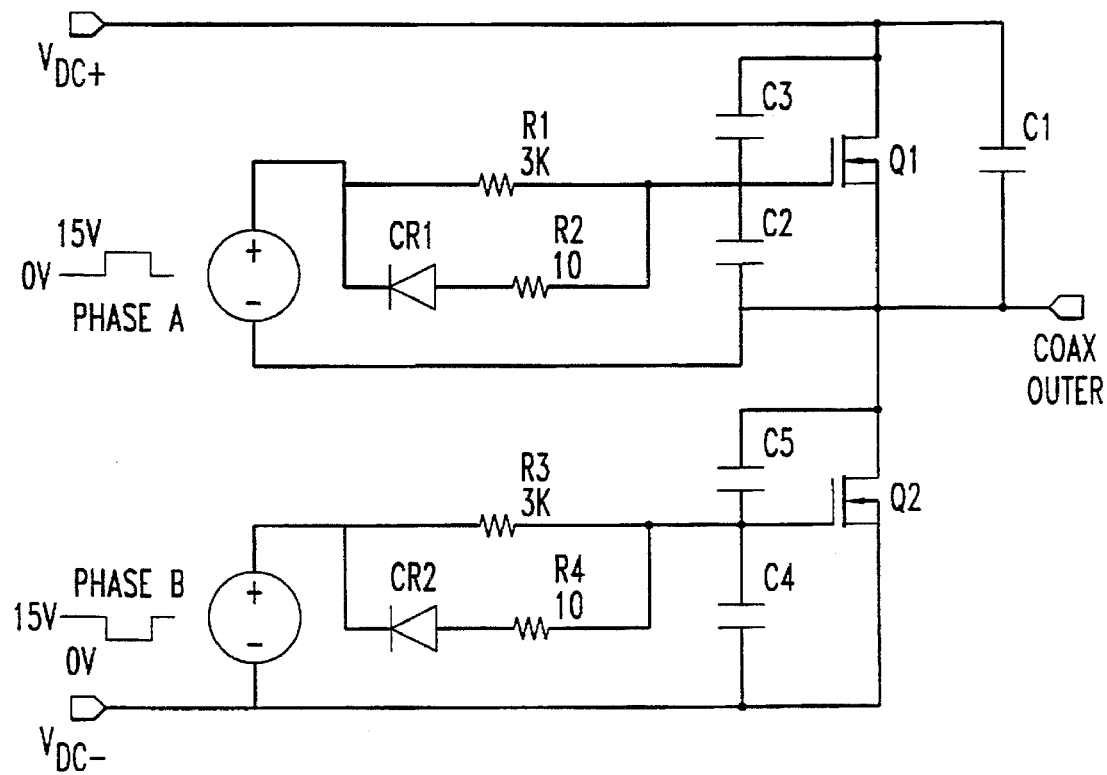
FIG. 2 is a schematic of a slew rate control circuit for application to the polarity switching circuit of FIG. 1.

FIG. 2 discloses a controlled slew rate drive circuit as applied to Q1 and Q2 which control the COAX outer voltage. In an unregulated Battery polarity switch, the same circuit would be used for Q3 and Q4 going to inner coax except that the phase is reversed. This circuit may be best under stood by describing its operation. In the circumstances where Phase A goes high and Phase B goes low the slew rate of the polarity change to the COAX outer is controlled as follows.

With Phase B previously high, the gate voltage on Q2 is high and Q2 is on conducting and the COAX outer is at $V_{DC}-$. With Phase B transitioning and going low, the charge on the Q2 gate and capacitor C4 are rapidly being discharged through a low valued resistor R4 and diode CR2, thereby rapidly turning Q2 off. The charge on C1 holds the COAX outer at $V_{DC}-$.

With Phase A previously low, gate voltage on Q1 is zero and Q1 is off non- conducting. When Phase A goes high, capacitor C2 and the gate capacitance of Q1 slowly charge through a high resistance value provided by resistor R1. Diode CR1 is reverse biased, so no current flows through R2. Capacitor C2 along with the gate capacitance Q1 serve to provide a turn on delay for Q1, to insure that Q2 is fully off before Q1's gate voltage reaches its turn on threshold.

When current through resistor R1 charges Q1's gate to its turn on threshold (about 4–5 volts on the gate), Q1 slowly turns on and starts charging C1 at COAX outer upwards from $V_{DC}-$ towards $V_{DC}+$. This voltage rise will be slowed down by capacitor C3, from gate to drain of Q1, an added "Miller" capacitance which absorbs the gate drive current through resistor R1 as the terminal voltage of COAX outer rises, or as Q1's drain to source voltage is reduced. The rate of COAX outer's voltage rise will be held at a controlled rate to maintain Q1's gate voltage at its turn on threshold during the voltage polarity transition of COAX outer from $V_{DC}-$ to $V_{DC}+$. During this turn- on, capacitor C3 is discharged by approximately the entire Battery/DC voltage. The rise time is thereby controlled to be: Battery/DC voltage times the capacitance of C3 divided by the current through resistor R1. The current in resistor R1 is controlled by the control Phase A voltage amplitude (15 volts in Figure A) minus the switch Q1's gate turn-on voltage threshold divided by the resistance of resistor R1. For the illustrative values shown in FIG. 2 and a turn-on threshold of 4 volts for Q1, the transition time is 2.7 milli-seconds. Once the capacitor C3 is discharged, the gate voltage on Q1 will charge to 15 volts through resistor R1, turning it on into hard saturation. This completes the transition of COAX outer from $V_{DC}-$ to $V_{DC}+$.

When Phase A goes low and Phase B goes high the DC voltage output is again inverted or reversed. With the Phase A voltage previously high, gate voltage on Q1 is high and Q1 is on conducting and the COAX outer is at VDC+. With Phase A voltage going low, the charge on the Q1 gate and capacitor C2 are rapidly discharged through low resistor value of resistor R2 and diode CR1, thereby rapidly turning Q1 off. The charge on capacitor C1 holds COAX outer at $V_{DC}+$.

With Phase B previously low, the gate voltage on Q2 is zero and Q2 is off non-conducting. When Phase B goes high, C4 and the gate capacitance of Q2 slowly charges through the high resistance value of resistor R3, diode CR2 is reverse biased, so no current flows through resistor R4. Capacitor C4 along with the gate capacitance serves to provide a turn on delay for Q2, to insure that Q1 is fully off before Q2's gate voltage reaches its turn on threshold.

When current through resistor R3 charges Q2's gate to its turn on threshold (about 4-5 volts on the gate), Q2 slowly turns on and starts charging capacitor C1 at COAX outer downwards from $V_{DC}+$ towards $V_{DC}-$. This voltage fall will be slowed down by capacitor C5 from the gate to drain of Q2, an added "Miller" capacitance which absorbs the gate drive current through resistor R3 as COAX outer falls, or as Q2's drain to source voltage is reduced. The rate of COAX outer's fall will be held at a rate to maintain Q2's gate voltage at its turn on threshold during the transition of COAX outer from $V_{DC}+$ to $V_{DC}-$. During this turn-on capacitor C5 is discharged approximately the entire Battery/DC voltage range. The fall time is thereby controlled to be Battery/DC voltage times capacitance C5 divided by the current through resistor R3. The current in R3 is defined by the control Phase B voltage amplitude (15 volts in Figure A) minus Q2's gate turn-on threshold voltage divided by the resistance of the resistor R3. For the illustrative values shown in FIG. 2 and a turn-on threshold of 4 volts for Q2, the transition time is 2.7 milliseconds. Once the capacitor C5 is discharged, the gate voltage on Q2 will charge to 15 volts through resistor R3 turning it on into hard saturation. This completes the polarity transition of COAX outer from $V_{DC}+$ to $V_{DC}-$.

The slew control described above is shown applied to the COAX outer terminal. An identical slew control is applied to the COAX inner terminal. It is not believed necessary to specifically describe this particular circuitry since it is identical to that described.

An advantage of the present invention is that both main switches are allowed to be N-channel FET's (or NPN transistors if bipolars are used). These are much cheaper than P-channel FET's (or PNP bipolar transistors). The polarity switching circuit may be additionally regulated by adding pulse width modulation to control the output voltage.

While a specific exemplary polarity switching circuit has been disclosed many other circuits may be devised without departing from the spirit and scope of the invention. Many other arrangements will suggest themselves to those skilled in the art without departing from the spirit and scope of the invention.

The invention claimed is:

1. A voltage polarity switching circuit, comprising:
    an input for accepting a DC voltage and an output for supplying a low frequency alternating voltage;
    a switching circuit including a plurality of power switching devices operating in pairs for inverting the DC voltage supplied at the input wherein:
    a first pair of the plurality of power switching devices conducts in a first phase while a second pair of the plurality of power switching devices does not conduct, and
    the second pair conducts and the first pair does not conduct in a second phase; the DC voltage being converted into an alternating voltage by alternatively enabling the first and second pairs to conduct; and
    circuitry to control a voltage waveform transition from the conducting one of the first and second pairs to the non-conducting one of the first and second pairs, comprising:
        first and second capacitors connecting first and second main path conduction terminals to a control terminal, respectively, and
        a drive signal to the control terminal supplied through a drive circuit having a directional determined current impedance to enhance turn off of the conducting one of the first and second pairs and to gradually turn on the non-conducting one of the first and second pairs, wherein the newly turned on, previously non-conducting pair actively transitions the voltage from one potential to another potential.

2. In the voltage polarity switching circuit as claimed in claim 1, wherein,
    the power switching device is a FET semiconductor having drain and source terminals connected as the semiconductor's main conduction path and the control terminal is a gate terminal with inherent capacitance.

3. In the voltage polarity switching circuit as claimed in claim 2, wherein,
    the first and second main path conduction terminals are shunted by a third capacitance.

4. In the voltage polarity switching circuit as claimed in claim 1, wherein, the directional determined current impedance comprises a pair of parallel circuits each having a first parallel path including a first resistor and a second parallel path including a second resistor serially connected to a diode.

* * * * *